United States Patent [19]
Trodden

[11] Patent Number: 5,969,576
[45] Date of Patent: Oct. 19, 1999

[54] PHASE LOCKED LOOP LOCK CONDITION DETECTOR

[75] Inventor: Thomas J. Trodden, Albuquerque, N.Mex.

[73] Assignee: Philips Electronics North America Corporation, New York, N.Y.

[21] Appl. No.: 08/995,471

[22] Filed: Dec. 22, 1997

[51] Int. Cl.$^6$ ................................................. H03L 7/095
[52] U.S. Cl. ...................... 331/1 A; 331/25; 331/DIG. 2
[58] Field of Search .......................... 331/1 A, 25, DIG. 2

[56] References Cited

U.S. PATENT DOCUMENTS

| | | | |
|---|---|---|---|
| 4,806,878 | 2/1989 | Cowley | 331/1 A |
| 5,189,379 | 2/1993 | Saito et al. | 331/1 A |
| 5,530,383 | 6/1996 | May | 331/DIG. 2 |

OTHER PUBLICATIONS

Kaenel et al, "A 320 MHz, 1.5 mW @ 1.35 V CMOS PLL for Microprocessor Clock Generation", IEEE Journal of Solid State Circuits, Nov. 1996, vol. 31, No. 11, pp. 1715–1722.

*Primary Examiner*—Siegfried H. Grimm
*Attorney, Agent, or Firm*—Brian J. Wieghaus

[57] ABSTRACT

A lock detector for a phase locked loop circuit, wherein an oscillator is controlled by a control signal produced by comparing the output signal of the oscillator to a reference signal. The lock detector samples the control signal, examines a plurality of samples according to criteria associated with a prescribed lock condition between the reference signal and the oscillator output signal, and generates a lock signal indicative of the lock condition being met if the samples satisfy the criteria. In a favorable embodiment, the lock detector forms a first group of samples sampled at a rate controlled by the reference signal and a second group of samples sampled at a rate controlled by the oscillator output signal. The samples are stored and shifted at the respective rates in respective shift registers. The contents of each stage of the shift registers are then examined according to a logic function. In an embodiment, the control signal includes first and second commands and is subjected to an initial logic function whose output is sampled by the shift registers.

21 Claims, 6 Drawing Sheets

PHASE LOCKED LOOP LOCK CONDITION DETECTOR

BACKGROUND OF THE INVENTION

1. Field of the Invention

The invention relates generally to Phase Locked Loop ("PLL") circuits and, more particularly, to a lock condition detector for use with a phase locked loop. The invention also relates to a method of detecting a lock condition in a PLL circuit.

2. Description of the Prior Art

Figure 1:
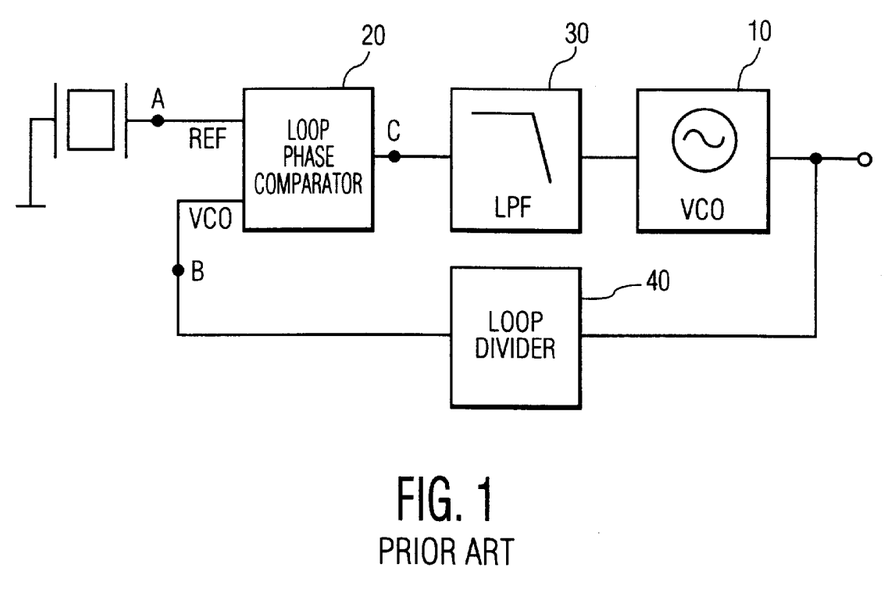
FIG. 1 is a block diagram of a PLL circuit in its most basic form (prior art)

PLL circuits are used in a variety of applications including microprocessors, digital video systems, and mobile communication devices, such as cell phones. A PLL circuit is used where a clock signal needs to be generated and synchronized to another source, such as an external reference signal. In its most basic form, as illustrated in FIG. 1, a PLL circuit includes a voltage controlled oscillator ("VCO") 10, which is an oscillator that can run over a range of frequencies dependant on a control voltage applied to a control terminal of the VCO. The VCO is driven by a phase error between the output of the VCO and a reference signal ("REF"), measured by a loop phase comparator 20. This error is used to change the control voltage in such a way that the error between the reference signal and the output of the VCO is reduced, with the goal of maintaining the output of the VCO the same as the reference signal with respect to phase and frequency. Typically, the PLL includes a filter 30 in the control voltage path to provide stability to the control loop. Additionally, by inserting a loop divider 40 between the phase comparator and the VCO, the output of the VCO can be made to be a multiple of the reference signal. The above illustrates the most basic form of a PLL. Examples of some advanced designs of PLL circuits are shown, for example, in U.S. Pat. Nos. 5,349,613; 5,475,718 and 5,349,613 and EP 0 433 120 A1.

Despite advances in control mechanisms, it still occurs that the output signal of the VCO becomes out of lock with respect to the reference signal. Out of lock means that the output signal of the VCO differs from the reference signal with respect to phase and/or frequency by a predetermined factor relevant to the application that the PLL is being used for. This typically occurs temporarily over a few clock cycles as a result of inherent delays in the feedback path. This may also occur, for example, because it takes a finite time for the output of the VCO to change in response to a change in the reference signal. In certain applications, it is desirable that the device, in which the PLL is used, either perform a certain function or not perform a certain function if the PLL goes out of lock. For example, in microprocessors, an indication of PLL lock is useful when the microprocessor is starting up from a power-off state. Until the PLL has locked onto the correct frequency, the microprocessor is held in a reset state to prevent incorrect operation due to spurious clocks of the wrong frequency. This is particularly important when time (i.e. frequency) critical devices such as UARTs or communication devices are controlled by the microprocessor.

Accordingly, it is an object of the invention to provide a lock detection circuit which indicates when two signals are out of lock.

It is another object of the invention to provide such a circuit which generates a signal when the out of lock condition is detected to control the operation of a device containing the PLL.

Yet another object of the invention is to provide a topology for a lock detector circuit which gives great flexibility to a circuit designer in defining and implementing the lock condition.

SUMMARY OF THE INVENTION

Generally speaking, according to the invention, a lock condition detector detects whether a prescribed locked condition has been met based on a sampling and analysis of a control signal generated within a PLL. The lock detector samples the control signal from the PLL's comparator and forms a group of samples by time shifting the samples at the sampling rate. The detector includes a circuit portion which examines the group of samples according to criteria associated with a lock condition between the reference and the output clock signal.

The invention is based on the recognition that a lock condition detector, instead of implementing a direct comparison of the reference and oscillator signals, may make use instead of one or more control signals available in known PLL circuits. Such control signals generally are more active when the reference and oscillator signals are out of lock and therefore serve as a reliable indicator of the in or out of lock condition. Additionally, because the control signals, similar to the reference and oscillator signals may be at very high frequency, the time shifting of a plurality of successive samples effectively reduces the response time needed for analyzing the samples by a factor equal to the number of time shifted samples in the group examined.

According to one aspect of the invention, the sampling rate is controlled by either of the reference signal, the output clock signal from the PLL, or the divided clock signal, as these signal are readily available.

According to another favorable aspect of the invention, the lock condition detector forms two groups of time shifted samples, one of the groups being formed by sampling and time-shifting at the rate of the reference signal and the other of the groups being formed by sampling and time shifting at the rate of the divided output clock signal. Both groups of samples are examined to test the lock condition. By forming two groups of samples, each sampled at a rate controlled by a different one of the reference and oscillator clock signals, it has been found that control signals associated with the phase locked loop being out of lock are more reliably detected.

Favorably, the lock detection circuit further includes an input logic section which implements a logic function on the control signal and outputs a logic signal which serves as the sampled signal. The input logic circuit defines in part the criteria for the in lock condition and/or otherwise serves to manipulate the control signal, for example, to combine two commands of the control signal into one signal for analysis.

The invention also relates to a method of generating a lock detection signal from a phase locked loop circuit of the above described type, as well as to the combination of a PLL and the lock condition detector.

These and other object, features and advantages of the invention will become apparent with reference to the following detailed description and the drawings.

BRIEF DESCRIPTION OF THE DRAWINGS

FIG. 2(*a*) is a block diagram of one embodiment of a lock condition detector circuit according to the invention;

FIG. 2(*b*) is a block diagram of a second embodiment of a lock condition detector according to the invention;

FIG. 3(*a*) is a block diagram of the phase comparator of FIG. 1;

FIGS. 3(*b*)–3(*d*) are timing diagrams illustrating the REF and VCO signals, and a control signal of the phase comparator having two commands, in both the lock and unlock conditions of the PLL;

DESCRIPTION OF THE PREFERRED EMBODIMENTS

With reference to FIG. 1, generally in a PLL when the divided VCO signal from the VCO is in lock with respect to frequency and phase with the reference signal, the control signal from the loop phase comparator will be in what may be termed an "inactive" state, in that the control signal does not change the output of the VCO. However, when the reference and divided VCO signals are not in lock, the control signal influencing the VCO will be in an "active" state and causes the VCO to change its output so as to bring the two signals back within a specified lock condition. The control signals within a PLL therefore can be used to derive a signal which indicates the lock condition of the PLL.

Figure 2A:
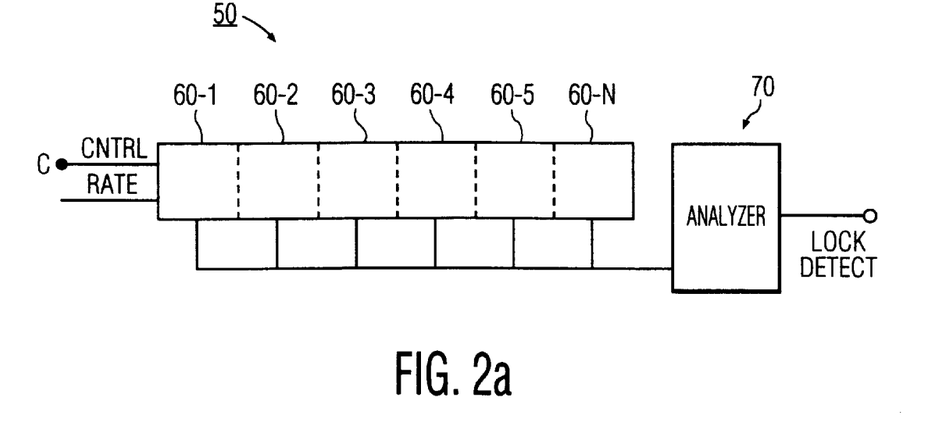

FIG. 2(a) illustrates one embodiment of a lock condition detector 50 according to the invention, which determines whether a PLL is within a desired lock condition, based on time integration of a control signal controlling the oscillator frequency of the VCO. The detector includes a time integrator 60 having a plurality of stages 60-1 through 60-N. The time integrator samples a control signal ("CNTRL") generated by the PLL at a sampling rate ("RATE") and shifts each sample successively though the stages 60-1 through 60-N. An analyzer 70 is coupled to read the contents of at least a plurality of the stages 60-1 through 60-N and outputs a signal indicative of whether the contents of the stages satisfy or do not satisfy a predetermined condition corresponding to a desired in lock condition of the PLL. Typically, the CNTRL signal will be a digital signal which switches between a logic high value and a logic low value. In that case the contents of the shift registers will consist of "0s" and/or "1s". The analyzer may analyze the contents of each stage and output an out-of-lock signal if, for example, any of the stages contains a "0".

The control signals, as with the REF and VCO signals, are typically at very high frequency, on the order of tens of MHZ and in some cases 100's of MHZ. It has been found that with such high frequencies, analyzer circuits, such as known logic circuits, frequently miss perturbations in the control signal associated with an out of lock condition. By time integrating samples of the control signal through multiple stages, the effective frequency of the signal to be analyzed is reduced, since the perturbation to be detected will be present in the time integrator over a number of cycles of the RATE signal equal to the number of stages N. This may be controlled through appropriate selection of the clocking rate for the integrator and the number of stages N, in dependence on the operating frequencies of the PLL and the choice of circuitry for the analyzer 70. While the RATE signal may be independently provided, in most applications it will be desirable to use either the REF signal, the VCO signal, or the divided VCO signal as the RATE signal for clocking the time integrator 60, as these signals are already available from the PLL.

Figure 2B:
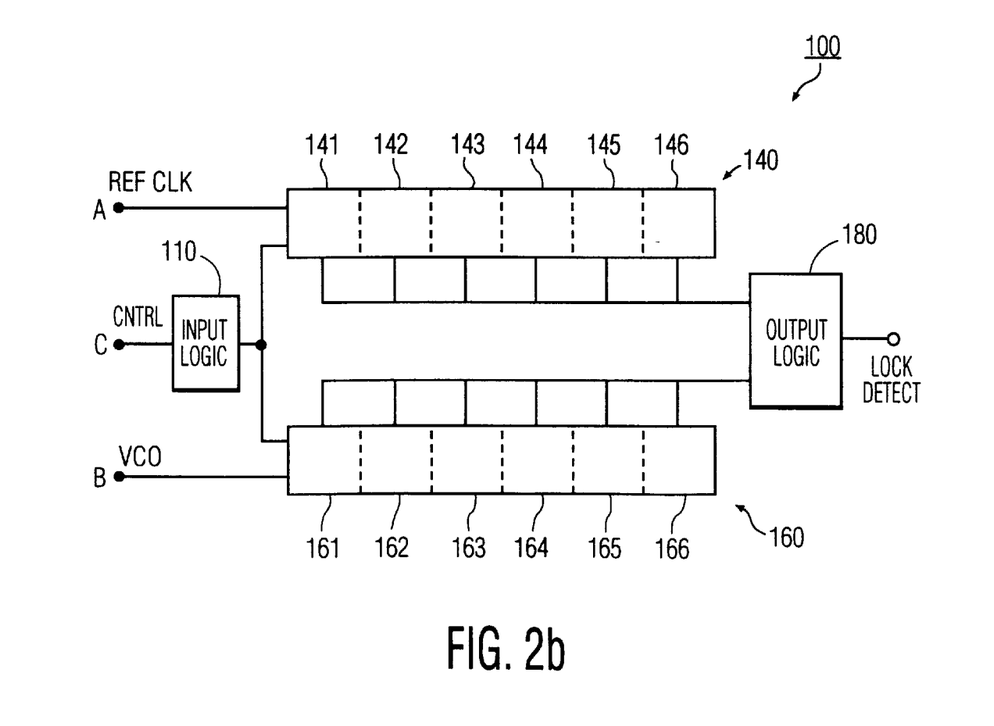

FIG. 2(b) is a block diagram of a second embodiment of the lock condition detector. The detector 100 includes an input logic section 110 which receives a control signal CNTRL controlling the frequency of the VCO. The input logic section 110 is used in part to adapt the control signal(s) from the PLL and in part to define the in-lock condition of the PLL. Instead of a single time integrator, the lock detector of FIG. 2(b) includes two integrators. A first time integrator 140 samples the output of the input logic section at a rate clocked by the reference signal REF and a second time integrator 160 similarly samples the output of the input logic section, but at a rate controlled by the oscillator signal from the VCO. Each integrator 140, 160 is embodied by a multi-bit shift register, for example having six stages (141–146; 161–166) in the Figure. The output of the input logic section is a logic signal, having a logic high or a logic low value. The shift register 140 samples the output of logic section 110, with the output shifting through the stages 141–146 at a sampling rate controlled by the reference clock. Similarly, the shift register 160 samples the output of logic section 110 but at a sampling rate equal to the frequency of the VCO. Thus, the shift registers effectively save and spread out the output signal over a number of cycles (of the respective signal VCO or REF) equal to the number of stages of the shift register. The output logic section 180 is coupled to receive the logic value of the stages of the first and second time integrators. The output logic section further defines the lock condition and outputs a lock detection logic signal indicative of whether a prescribed lock condition has been met. The advantage of having two shift registers each clocked by a respective one of the REF and VCO signals is that each will be clocked at a different rate when the PLL is out of lock, due to the REF and VCO signals having different frequencies. It has been found that this leads to more reliable detection of perturbations in the control signal, since one register clocked at a first rate will tend to reveal perturbations not sampled by the other register clocked at a different rate.

Figure 3A:
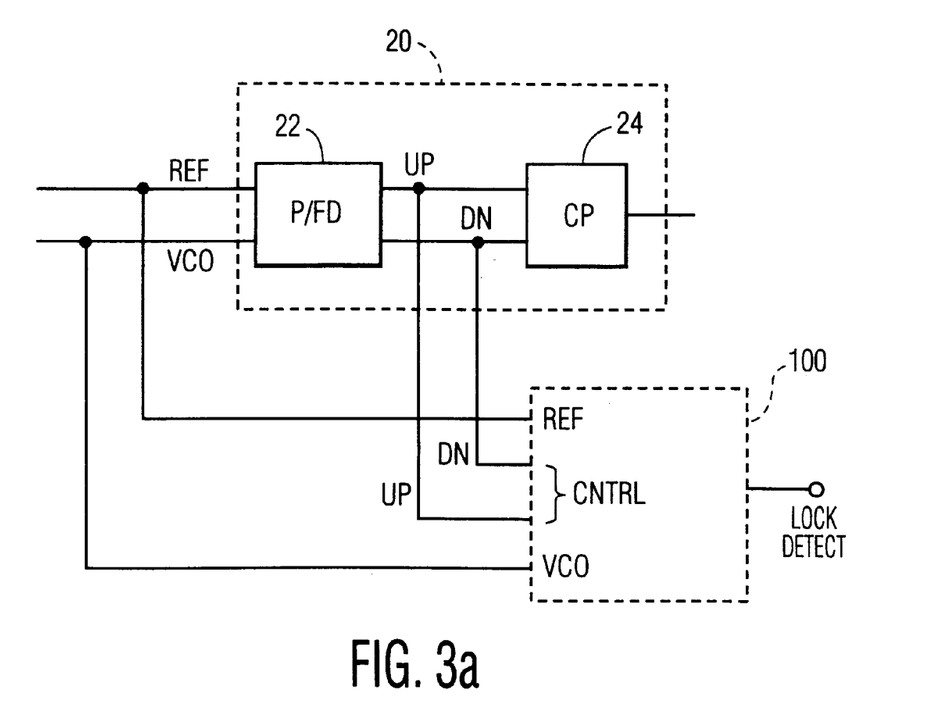

FIG. 3(a) illustrates an exemplary embodiment of the loop phase comparator 20 of the PLL of FIG. 1. The comparator 20 includes a phase frequency detector ("P/FD") 22 having a first input receiving the reference signal REF and a second input receiving the divided VCO signal from the VCO. The comparator outputs a control signal consisting of two commands UP and DN which are fed to respective inputs of a charge pump ("CP") 24. The charge pump, based on the received command UP and DN, supplies a control voltage which after filtering by filter 30, controls the operation of the VCO. The specific P/FD and CP circuits are known, for example, from the article: Kaenel et al, "A 320 MHZ, 1.5 mW@ 1.35 V CMOS PLL for Microprocessor Clock Generation", IEEE Journal of Solid State Circuits, November 1996, Volume 31, Number 11, page 1716 (herein incorporated by reference). In the disclosed circuit, the UP and DN commands from the P/FD are also logic signals. In this implementation, the UP command is activated to reduce the frequency of the VCO by pulling the charge pump up to the rail voltage. The DN command is activated to pull the charge pump down to the rail voltage, which thereby increases the frequency of the VCO. Both of the UP and DN commands are clocked by the reference signal, and edge triggered on the rising edge (i.e. a low to high transition). The UP command is a low true signal, meaning it is active to reduce the frequency of the VCO when it is a logic low. It is inactive when logic high. The DN command is a true high signal, meaning it is inactive when logic low and active to increase the frequency of the VCO when logic high.

Figure 3B:
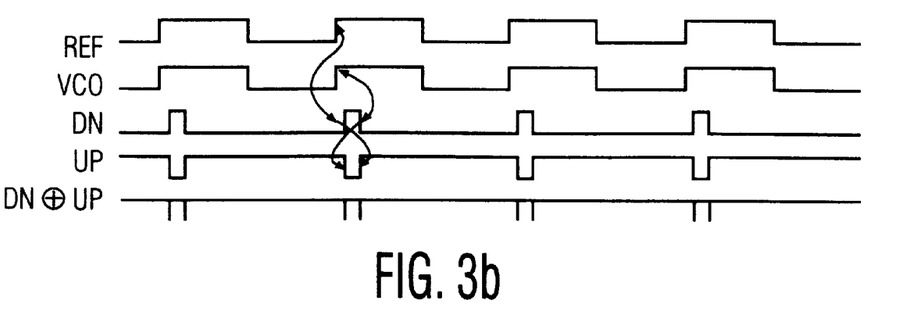
Figure 3C:
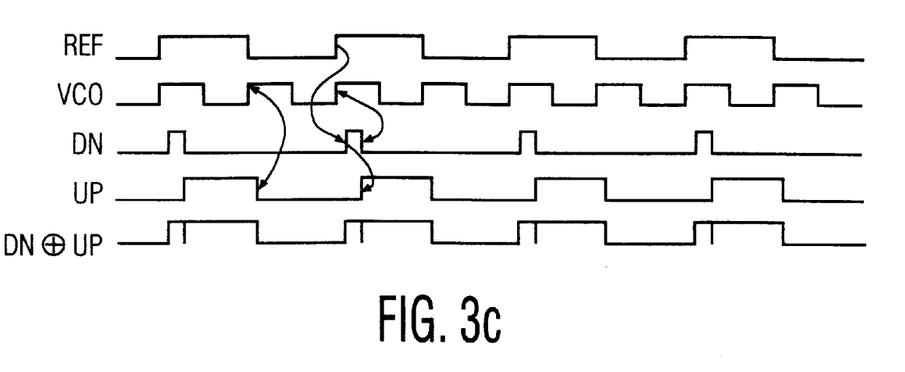
Figure 3D:
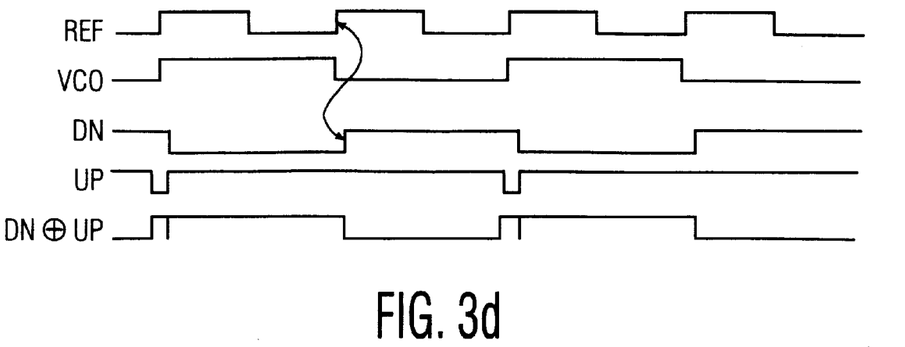

FIGS. 3(b)–3(d) are timing diagrams illustrating the UP and DN commands in the active state and inactive states for three cases of a typical P/FD implementation. FIG. 3(b)

illustrates the in-lock condition, with $f_{VCO}=f_{REF}$. During any given cycle or loop, the UP and DN commands have both an active and an inactive period. However, when the PLL is in lock, these periods of active and inactive states are identical between the two commands, and taken together form an "inactive" control signal in that the output of the VCO remains the same. Note that since the UP command is a true low and the DN command is a true high, the UP and DN commands in FIG. 3(a) have equal states. This can be seen by performing a simple comparison of the two signals with a combinatorial logic function, in this case an EXCLUSIVE OR ("XOR") function on the two commands. When the UP and DN commands are identical with respect to active and inactive states, the result of the XOR operation produces a logic one. If during a cycle, the result of comparing the two control signals results in a logic one for the entire cycle, the PLL is said to be in lock for that cycle. The other two cases presented in FIGS. 3(c) and 3(d) illustrate out of lock conditions produced when the generated VCO frequency is either faster ($f_{VCO}=2f_{REF}$) or slower ($f_{VCO}=0.5f_{REF}$) than the reference frequency. In both of these cases, the direct comparison of the control signals produces periods within a given cycle when they are not identical, resulting in a logic zero when an XOR operation is performed. If at any point during a complete cycle or loop the result of comparing the two logic signals results in a logic zero, the PLL is said to be out of lock for that cycle.

Figure 4:
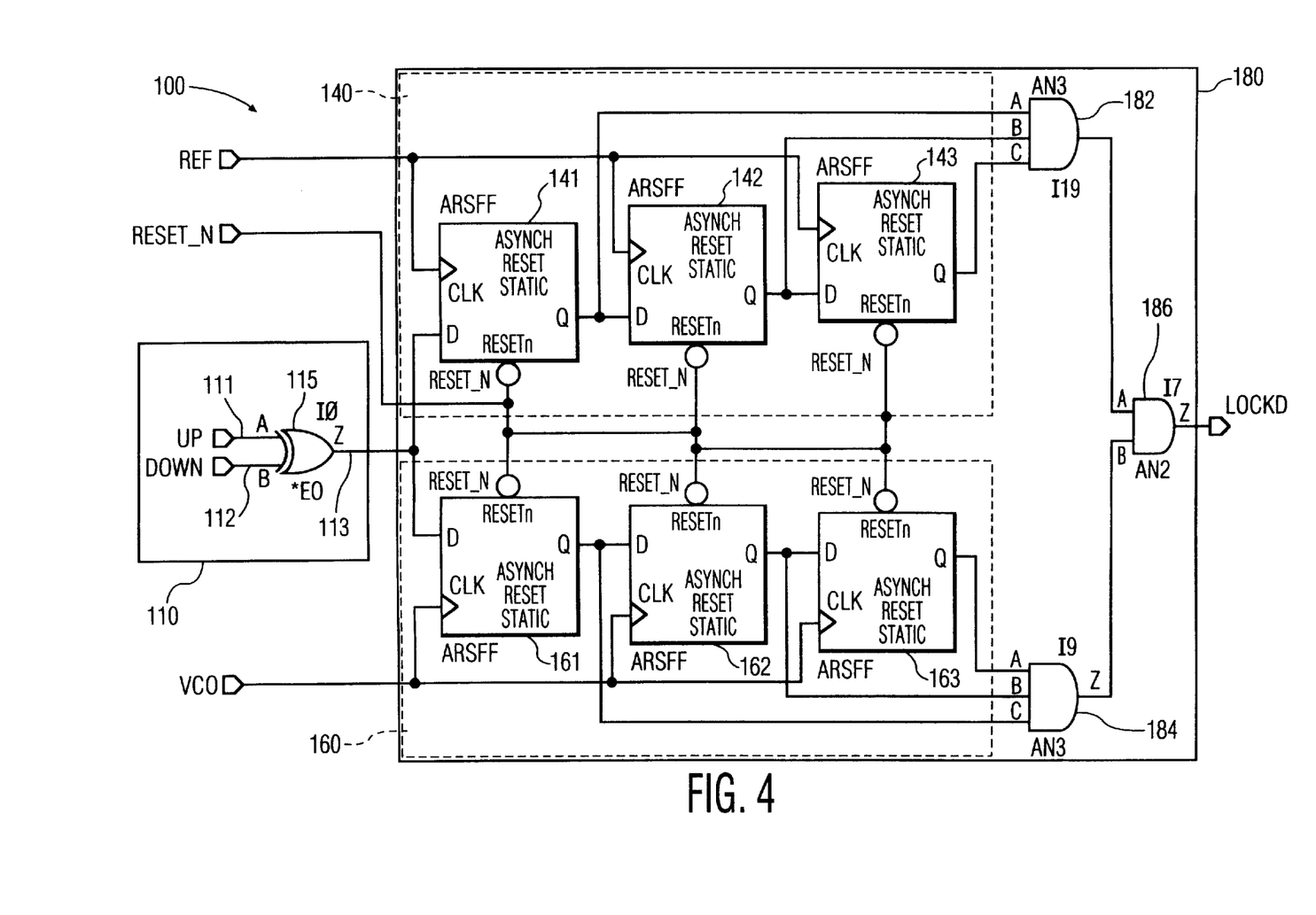
FIG. 4 is a schematic diagram of an exemplary embodiment of in-lock condition detector according to FIG. 2(a)

FIG. 4 is a circuit diagram of the embodiment according to FIG. 2(b), for use where the control signal includes two commands, UP and DN, as illustrated above. In FIG. 4, the input logic section 110 is an EXCLUSIVE OR ("XOR") gate 115 having a first input 111 receiving the UP signal from the P/FD 22 and a second input 112 receiving the DN signal from the P/FD 22. The XOR gate has an output 113 which outputs the EXCLUSIVE OR function of the UP and DOWN signal. In other words, XOR gate 115 outputs a logic high signal only when either of the UP and DN commands is logic high. The XOR gate 115 outputs a logic low signal whenever both of the UP and DN commands are logic high and whenever both of the UP and DN commands are logic low.

The first shift register 140 includes a plurality N (in this case N=3) of D-type flip-flops ("DFF's") 141, 142, 143. Each of the DFF's includes a clock input ("CLK"), a data input ("D"), an output ("Q") and a reset input ("RST"). Each of the CLK inputs is edge triggered, which means that the DFF transfers the data present at its input D to the output Q whenever the signal at its CLK input changes from logic low to logic high, i.e at a rising edge of that signal. Each of the CLK inputs of DFF's 141, 142, 143 are coupled to receive the reference clock signal from the PLL, with the RST input of each DFF also receiving the reset signal. The D input of the first DFF is coupled to the output 113 of the XOR gate 115. Each successive DFF 142, 143 has its D input coupled to the output Q of the previous DFF in the chain.

The chain 160 has a number M of DFFs associated with the oscillator signal from the VCO of the PLL. In this instance, the oscillator signal is the divided oscillator signal and the number N is equal to the number N of the chain 140. As is clear from FIG. 2, the DFFs 161, 162, 163 are arranged in a similar manner as the DFF's of chain 140, except that the CLK input of DFF's 161, 162 and 163 are coupled to receive the divided oscillator signal.

The logic output section 180 is coupled to the output Q of each of the DFF's of both chains 140 and 160. In the embodiment shown, the logic section 180 includes a first AND gate 182 having each of N inputs coupled to a respective different one of the outputs Q of the DFF chain 140. Similarly, AND gate 184 includes M inputs each coupled to a respective different output Q of the DFF chain 160. An AND gate 186 has an input coupled to the output of each of the AND gates 182 and 186. The AND gate 186 outputs a logic high or a logic low signal indicative of whether the divided oscillator signal and the reference signal are within a prescribed lock condition, the prescribed lock condition being determined by the number of DFF's in each chain and the configuration of the logic output section.

The digital lock detector of FIG. 4 functions as follows. The shift registers 140 and 160 each sample the output 113 of XOR gate 115 and shift the sampled output through the shift registers, clocked by the respective REF and VCO signals. When the PLL is in lock, as in FIG. 3(b), the output 113 will be logic high. Consequently, as long as the PLL is in lock, the contents of each stage of the shift registers 140 and 160 will be logic high and the output of logic section 180 will be logic high. If the PLL becomes out of lock, as in FIGS. 3(c) and 3(d) the UP and DN commands will not be balanced, and the output 113 of XOR gate 115 will switch to logic low for one or more clock cycles. The contents of the shift registers 140 and/or 160 will then include this logic value if it is present at a rising edge of the REF and/or VCO signals. Because the contents of at least one of the shift registers is now logic low, the output of AND gate 186 will be logic low, indicating that an out of lock condition exists in the PLL. Thus, the prescribed lock condition implemented by logic section 180 is "lock" if three consecutive "1s" are present in both shift registers 140, 160 and "unlock" if a single "0" is present in either of the shift registers 140, 160.

Note that once sampled, the logic low value will be present in the shift register 140 and/or 160 for at least three clock cycles, so the out of lock condition signal is present at the output for a duration approximately three times longer than if the three-bit shift registers had not been used. This makes the signal useful for inputting to a circuit having a slower clock rate than the PLL. Additionally, this makes the lock condition detector useful for testing high speed PLL's, as typical high speed test systems which directly sample the VCO and REF signals to determine a lock condition are expensive. This method of extending the duration of the error makes it possible to fit this lock detector to existing or inexpensive systems.

Figure 5:
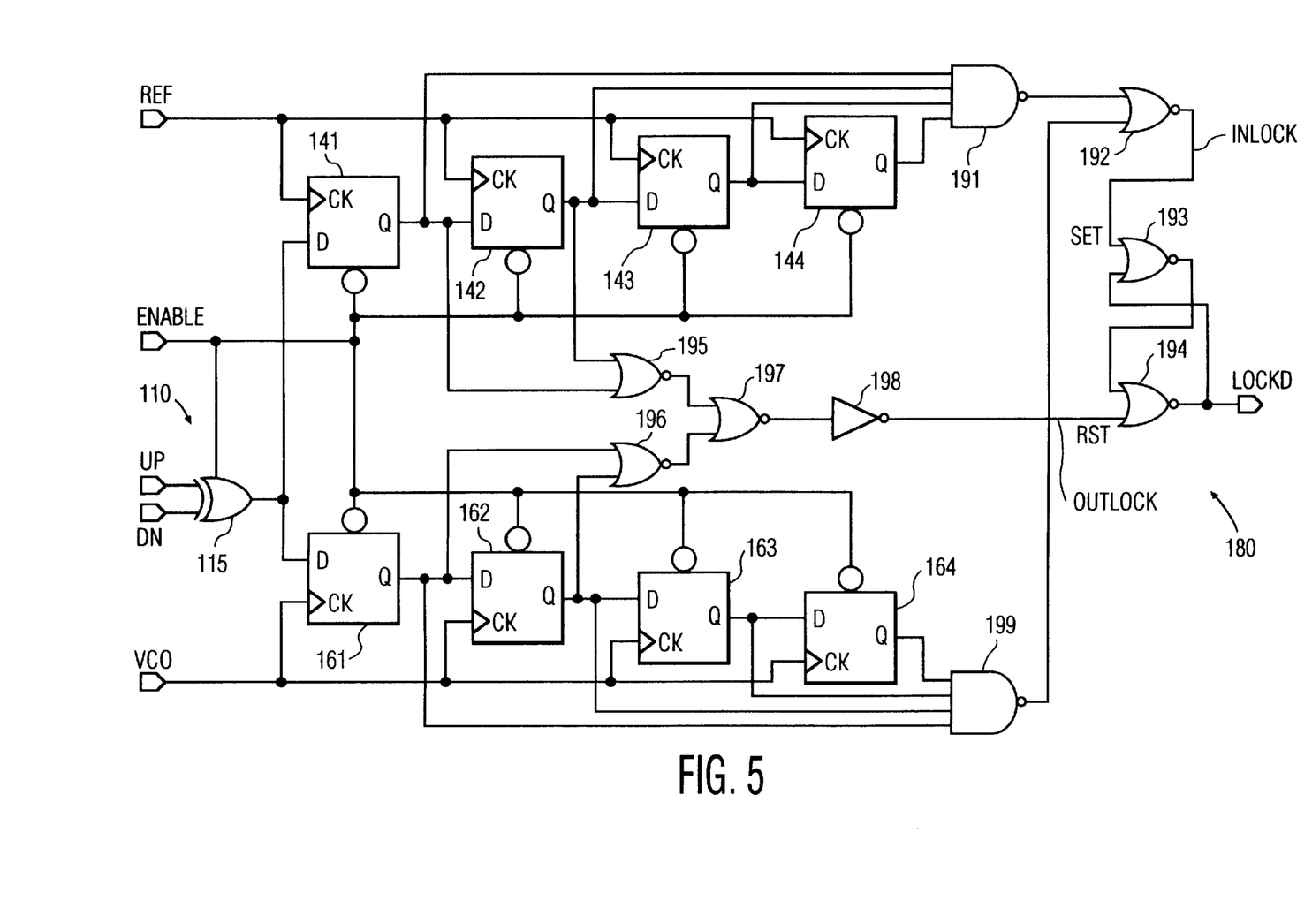
FIG. 5 is a schematic diagram of another embodiment illustrating the same topology as the circuit of FIG. 4, but implementing a different lock condition.

FIG. 5 illustrates a lock detector which allows the P/FD 22 one control loop for correction. If the out of lock condition is not corrected by the PF/D within one loop of its control cycle, the detector 100 will output an out of lock signal. Circuit elements with the same function as those in FIG. 4 bear the same reference numerals. Each of the shift registers includes 4 DFF's 141–144 and 161–164 fed by the input EXCLUSIVE OR gate 115 and clocked in the same manner as in FIG. 4. The logic output section includes a first logic string which tests for the in lock condition and which outputs an "INLOCK" signal. The first logic string includes a first NAND gate 191 having four inputs each connected to receive the output of a respective DFF 141–144 and a second NAND gate 199 having four inputs each connected to receive the output of a respective DFF 161–164. The output of the NAND gates 191 and 199 are input to a NOR gate 192, the output of which is the "INLOCK" signal. The NAND gates 191, 199 and NOR gate 192 perform the same logic function as the AND gates 182, 184 and 186 of the circuit of FIG. 4. In other words, only when all of the outputs of the DFF's 141–144 and 161–164 are logic high will the PLL be considered to be in lock and the "INLOCK" signal will be logic high. If any of the DFF's are logic low, the INLOCK signal will be logic low.

A second logic string detects whether a logic low exists for two cycles of the comparator loop and outputs an "OUTLOCK" signal. This string includes NOR gate 195 receiving the outputs of DFF's 141 and 142 and NOR gate 196 receiving the outputs of DFF's 161 and 162. The outputs of the NOR gates 195, 196 are input to NOR gate 197, whose output is inverted by inverter 198. The inverted output of device 198 is input to NOR gate 194. When the output of DFF's 141, 142 are both logic low, the output of NOR gate 195 will be logic high. Similarly, when the outputs of DFF's 161, 162 are both logic low, the output of NOR gate 196 will be logic high. When either or both of the outputs of NOR gate 195, 196 are logic high, the output of NOR gate 197 will be logic low and the output of inverter 198 will be logic high. Thus, when two consecutive logic lows are detected by either of the DFF's 141, 142 or 161, 162, the OUTLOCK signal will be high.

Now, the NOR gates 193 and 194 form an RS latch, with the INLOCK signal input to NOR gate 193 being the set input ("SET") and the OUTLOCK signal from the NOR gate 194 forming the reset signal ("RST"). As long as the INLOCK signal is logic high and the OUTLOCK signal is logic low, the output signal ("LOCKD") of NOR gate 194 will be logic high, which indicates the in lock condition. If a logic low occurs in any of the DFF's, the INLOCK signal will go logic low first. However, this will not change the LOCKD signal to logic low until two consecutive logic lows are detected in DFF's 141, 142 or 161, 162. When this occurs, the OUTLOCK signal goes high, and the LOCKD signal goes low, indicating out of lock. The LOCKD signal will remain logic low until all the DFF's in both chains are logic high.

Accordingly, the circuit of FIG. 5 implements an asymmetric lock condition in that it takes four consecutive logic highs in each DFF chain for the PLL to be in lock, but only two logic lows in either DFF chain to be out of lock. Once out of lock, the lock detect signal indicates out of lock until all DFF's are logic high.

It will be clear from the foregoing that other variations can be made without departing from the principles described herein. For example, it is clear that the input logic section will change in dependence on the type of control signals generated and sampled from the PLL. Additionally, the output section may implement any kind of test depending on the desired lock condition. Additionally, it should be clear that the input and output circuits may utilize any of the currently known programmable logic devices, so that a desired lock condition can be programmed by a user or even changed on the fly during operation of the of the PLL. Accordingly, while the preferred embodiments of the present invention have been shown and described, it will be appreciated by those skilled in the art that changes may be made in these embodiments without departing from the principles and spirit of the invention, the scope of which is defined in the claims.

The many features and advantages of the invention are apparent from the detailed specification and it is intended by the appended claims to cover all such features and advantages which fall within the true spirit and scope of the invention. Since numerous other modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A lock condition detector for use with a phase locked loop circuit having an oscillator generating an output oscillator signal and a comparator comparing the output oscillator signal to a reference signal, the comparator generating a control signal for controlling said oscillator, said lock condition detector comprising:

sampling means for taking samples of the control signal at a sampling rate and for time shifting a plurality of the samples at the sampling rate; and means for examining the time-shifted plurality of samples according to criteria associated with a lock condition between the reference and oscillator output signals.

2. A lock condition detector according to claim 1, further comprising means for generating a signal having a first value indicative of the lock condition being met if the samples satisfy the criteria and a second value indicative of the lock condition not being met if the samples do not satisfy the criteria.

3. A lock condition detector according to claim 1, wherein said sampling rate is at least one of (i) the frequency of the reference signal, (ii) the frequency of the oscillator output signal, and (iii) a multiple or fraction of the frequency of the oscillator output signal.

4. A lock condition detector according to claim 3, wherein:

said sampling means forms a first group of time-shifted samples of the control signal at a sampling rate controlled by the reference signal and second group of time-shifted samples of the control signal at a sampling rate controlled by the oscillator output signal; and said means for examining examines samples of the control signal from both of the first group of samples and from the second group of samples.

5. A lock condition detector according to claim 1, wherein for a PLL in which the sampled control signal includes a plurality of distinct command signals, said lock detector further comprising means for implementing a combinatorial logic function on said distinct command signals and outputting a logic signal, the logic signal being sampled by said sampling means.

6. A circuit, comprising:

a phase locked loop comprising (i) an oscillator generating an output oscillator signal and (ii) a comparator comparing the oscillator output signal to a reference signal, said comparator generating a control signal for controlling said oscillator; and a lock condition detector for detecting whether the oscillator output signal is within a prescribed lock condition relative to said reference signal based on the control signal generated by said comparator, said lock condition detector comprising a first time integrator including a plurality of stages, said first time integrator sampling the control signal from said comparator and shifting the value of the sampled signal through said plurality of stages at a rate controlled by one of (i) the reference signal and (ii) the oscillator output signal, and a logic circuit having inputs coupled to said stages of said integrator, said logic circuit implementing a logic function, associated with the prescribed lock condition, on a plurality of the values of the sampled control signal in said stages and outputting a lock detection signal indicative of the prescribed lock condition having been met.

7. A circuit according to claim 6, wherein:

said lock condition detector further comprises a second time integrator including a plurality of stages, said second time integrator shifting the value of the sampled signal through said plurality of stages at a rate controlled by the oscillator output signal, said first time integrator being controlled by the reference signal, and wherein said logic circuit has inputs coupled to a plurality of the stages of said second time integrator.

8. A circuit according to claim 7, wherein said lock condition detector further comprises an input logic section coupled between said comparator and said first and second time integrators, said input logic section implementing a logic function on the control signal and outputting a logic signal, said first and second time integrators sampling the logic signal output by said input logic circuit.

9. A circuit according to claim 8, wherein said comparator of said phase locked loop generates first and second logic control signals associated with increasing and decreasing, respectively, the frequency of the oscillator, said first and second logic control signals being input to said input logic section.

10. A circuit according to claim 9, wherein said first and second time integrators each comprise a respective shift register.

11. A circuit according to claim 10, wherein said logic circuit implements the logical AND of each of the stages of said first and second time integrators.

12. A circuit according to claim 10, wherein said input logic section implements the logical EXCLUSIVE OR of the first and second logic control signals generated by said comparator.

13. A circuit according to claim 7, wherein said first and second time integrators each comprise a respective shift register.

14. A circuit according to claim 6, wherein said lock condition detector further comprises an input logic section coupled between said comparator and said first time integrator, said input logic section implementing a logic function on the control signal and outputting a logic signal, said first time integrator sampling the logic signal output by said input logic circuit.

15. A circuit according to claim 14, wherein said comparator of said phase locked loop generates first and second logic control signals associated with increasing and decreasing, respectively, the frequency of the oscillator, said first and second logic control signals being input to said input logic section.

16. A method of generating a lock condition signal for a phase locked loop circuit having an oscillator generating an output clock signal and a comparator comparing the output of said oscillator to a reference signal, the comparator generating a control signal for controlling said oscillator, said method comprising the steps of:

taking a plurality of samples of the control signal at a sampling rate;

time shifting the plurality of samples at the sampling rate;

examining the plurality of time shifted samples according to criteria associated with a prescribed lock condition between the reference signal and the output clock signal; and generating a signal indicative of whether the lock condition criteria is met or not met.

17. A method according to claim 16, wherein said sampling rate is controlled by at least one of (i) the frequency of the reference signal,(ii) the frequency of the oscillator output signal.

18. A method according to claim 17, wherein:

said step of taking a plurality of samples includes forming a first group of samples of the control signal sampled at a rate controlled by the reference signal and a second group of samples of the control signal sampled at a rate controlled by the oscillator output signal; and said step of examining the plurality of samples comprises examining samples of the control signal from both of the first group of samples and from the second group of samples.

19. A method according to claim 16, further comprising the step of performing an input logic function on the control signal to obtain a logic signal, and said sampling step sampling said logic signal.

20. A method according to claim 19, wherein for a phase locked loop in which the comparator generates a control signal including a first logic signal associated with increasing the frequency of the oscillator and a second logic signal associated with decreasing the selected function, said step of performing an input logic function comprises implementing the EXCLUSIVE OR function on said first and second logic signals.

21. A method according to claim 18, wherein said step of examining the plurality of samples comprises implementing the logical AND function collectively on each sample of the first and second group of samples.

* * * * *